United States Patent [19]

Wiesmann

[11] Patent Number: 4,606,009

[45] Date of Patent: Aug. 12, 1986

[54] STEP RESPONSIVE AVERAGING FILTER

[75] Inventor: Thomas W. Wiesmann, Seattle, Wash.

[73] Assignee: John Fluke Mfg. Co., Inc., Everett, Wash.

[21] Appl. No.: 409,859

[22] Filed: Aug. 20, 1982

[51] Int. Cl.[4] .............................................. G06F 15/31
[52] U.S. Cl. .................................... 364/724; 364/734
[58] Field of Search ............... 364/200, 900, 715, 820, 364/736, 724, 825, 734; 333/165, 166, 167, 168

[56] References Cited

U.S. PATENT DOCUMENTS

| 3,370,292 | 2/1968 | Deerfield | 364/724 |
| 3,889,108 | 6/1975 | Cantrell | 364/724 |
| 4,075,703 | 2/1978 | Dillard | 364/715 |
| 4,187,000 | 2/1980 | Constant | 364/820 |
| 4,193,118 | 3/1980 | Nash et al. | 364/734 |
| 4,366,547 | 12/1982 | Miller | 364/724 |
| 4,488,251 | 12/1984 | Wischermann | 364/724 |
| 4,493,047 | 1/1985 | Werst | 364/724 |

Primary Examiner—David H. Malzahn
Attorney, Agent, or Firm—Mikio Ishimaru; Stephen A. Becker

[57] ABSTRACT

The storage units and the output of an averaging type recursive or non-recursive digital filter are modified by input signal changes greater than a predetermined amount indicative of a step change to provide a rapid step response characteristic.

18 Claims, 5 Drawing Figures

STEP RESPONSIVE AVERAGING FILTER

FIELD OF THE INVENTION

The present invention relates to improving the step response of averaging filters and more particularly to improving the step response of digital recursive and nonrecursive filters.

BACKGROUND OF THE INVENTION

In the past, one major problem with using recursive or nonrecursive digital filters has been their step response, or response to large changes in digital input signals, especially those containing noise, at low sampling rates. With these type of input signals, there is a substantial settling time or wait before the output of such a filter matches its input and an accurate, noise-minimized, reading can be obtained.

Further, these filters have been unsatisfactory for removing noise from short duration signals since the signal must last for at least the duration of the settling time before any significant reading can be obtained.

In the past, there have been two types of digital averaging filters. The first is the recursive averaging filter in which an input signal is added with a previously stored signal which has been multiplied by $(N-1)/N$ where N is a predetermined number of signal samples which are to be averaged as determined by the desired noise reduction factor. The sum signal, which is the input signal added to the previously stored signal, is then stored to be the previously stored signal for the next input signal. Simultaneously, the sum signal is modified by 1/N to be outputted as the filtered output signal. Reducing the number of samples N improves the step responsiveness and shortens the needed duration of the input signals, but it makes the output signal more subject to inaccuracy because of noise.

The second is the nonrecursive averaging filter in which the input signals are stepped through a series arrangement of storage units. An input signal is summed with the previously stored signals in each of the storage units and then is averaged to provide the final output signal. For a step change, the nonrecursive filter will require samples equivalent to the number of storage units plus one before the output will settle to its final value.

While the recursive filter is easier to implement in requiring only one storage unit, it is slower to settle than a nonrecursive filter. This is because the recursive filter output depends both on the values of input, present and/or past, and the past value of output while the nonrecursive filter output depends only on the present and past values of input. In both, the settling time may be reduced by reducing the number of samples averaged, but this reduces the noise immunity of both.

SUMMARY

The present invention provides a method and apparatus for providing a quick step responsive recursive and nonrecursive averaging filters.

The present invention provides a method and apparatus for providing quick step responsive recursive and nonrecursive digital averaging filters with a microprocessor.

The above and additional advantages of the present invention will become apparent to those skilled in the art from a reading of the following detailed description when taken in conjunction with the accompanying drawing.

DESCRIPTION OF THE PREFERRED EMBODIMENTS

Figure 1:
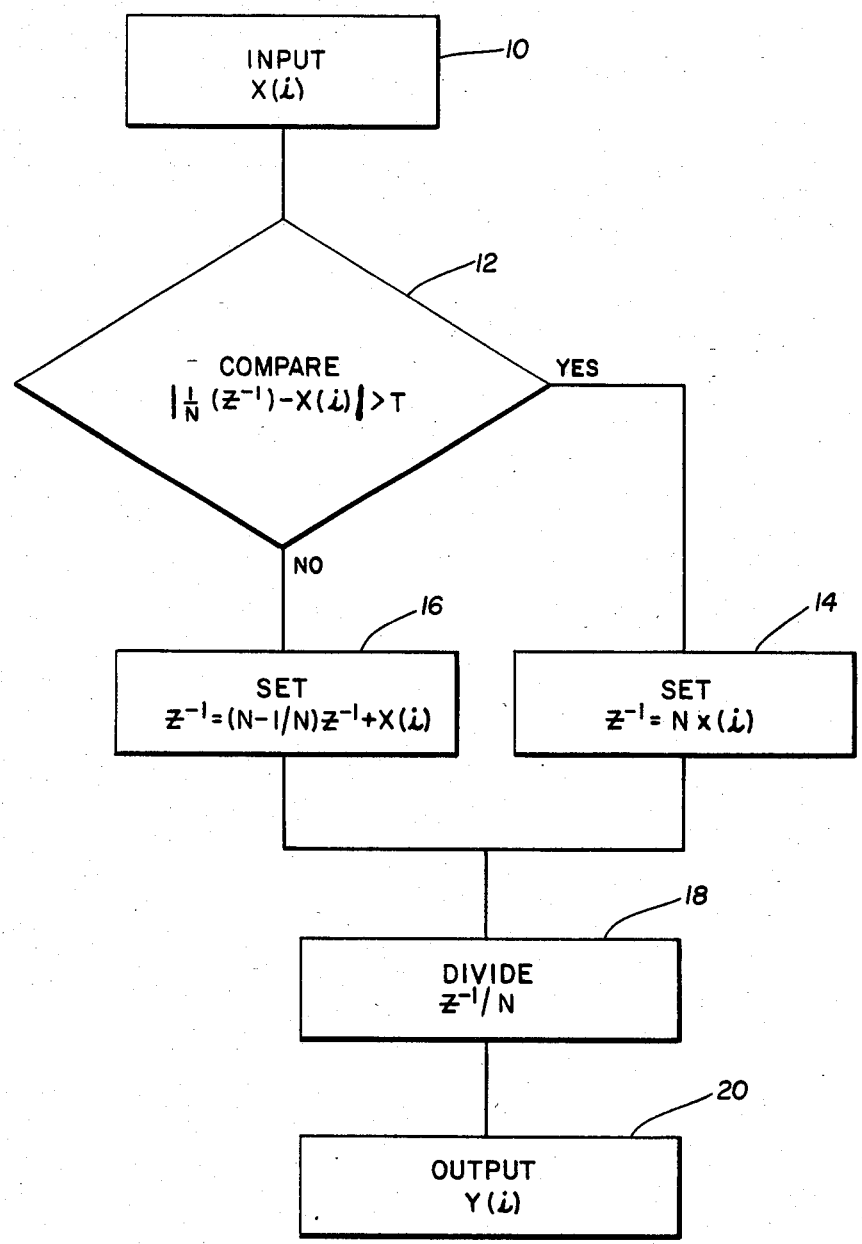
FIG. 1 is the flow chart of a program used in a microprocessor based device to practice the method of the present invention.

Referring now to FIG. 1, therein is shown the flow chart of a program for implementing a step responsive recursive digital filter using a conventional microprocessor (not shown).

FIG. 1 indicates that an input signal to be filtered is inputted to the microprocessor at input block 10 and passed to a compare block 12 where the difference between the input signal and a previously stored signal from a previous cycle held in the microprocessors' memory or storage unit is compared with present noise threshold signal T. The output after comparison is then outputted either to a set block 14 or a set block 16. The set block 14 sets or stores in the storage unit a new signal which is proportional to the input signal while the set block 16 stores a new signal equal to a portion of the previously stored signal plus the input signal.

From either the set block 14 or 16, the program proceeds to the divide block 18 where the signal being provided to the storage unit is divided by the pre-established number of samples. The divided signal is then provided to the output block 20 where the filtered signal is outputted from the microprocessor.

In practice, the entire filter including the quick step response feature is achieved by processing in the microprocessor.

In operation, a digital input signal X(i), where "i" is this i-th signal, is provided under the control of input block 10 to the compare block 12. In this stage, the program has the microprocessor take the contents of its storage unit having a unit delay $Z^{-1}$, which content initially may be a random number, and multiply it by 1/N where N represents the pre-established number of signals to be averaged in order to achieve a desired noise reduction factor. The resultant $1/N\,(Z^{-1})$ which is a portion of the previously stored signal has subtracted from it the input signal X(i) to determine the difference therebetween. The program then has the microprocessor determine the absolute value of the difference and compare it with a predetermined noise threshold T. This threshold T is determined empirically to achieve maximum step response with minimum effect from expected noise.

If the threshold T has been exceeded, the signal change is attributed to a step change in input signal X(i) rather than noise. The microprocessor then will select set block 14 which sets the content of the storage unit to be equal to N times the input signal X(i). The program then continues to divide block 18 where the new previously stored signal inputted into the storage unit is also divided by N to provide the averaged output signal X(i)

as outputted per the output block 20. This makes the step change immediately effective.

If the absolute value of the difference is less than the noise threshold T, the input signal X(i) change is probably attributable to noise and no step change in the input signal X(i) has occurred. The microprocessor will then select set block 16 which sets the content of the storage unit to be equal to $((N-1)/N)Z^{-1}+X(i)$ which is essentially the previously stored signal in the storage unit being modified by proportion related to the pre-established number of input signals being further modified by addition of the new input signal X(i). The new stored signal value sent to the storage unit is also divided by the divide block 18 which averages the signal to provide the final output signal X(i) which is the recursive average of the input signal.

Essentially, if the input signal X(i) changes by more than the amount normally attributable to noise, the microprocessor will proceed under control of the set block 14 and immediately replaces the recursively summed signal in the storage unit. If the input signal X(i) changes by an amount normally attributable to noise, the microprocessor will proceed under control of set block 16 and will add the input signal to the previously recursively summed signal where the noise effect will be minimized by averaging under control of divide block 18.

Figure 2:
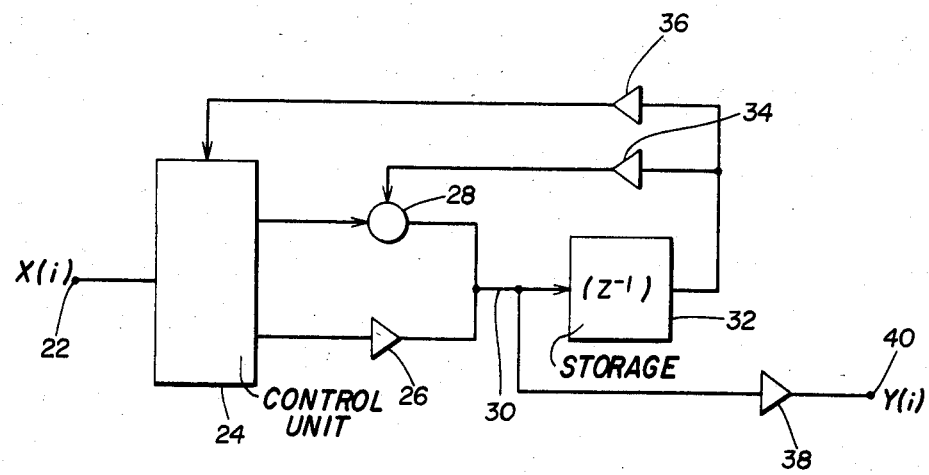
FIG. 2 is a block diagram of a recursive filter embodying the present invention.

Referring now to FIG. 2, therein is shown a block diagram of a recursive averaging filter including an embodiment of the current invention. An input terminal 22 is connected to a control unit 24 which maybe an input signal controlled switch. The control unit 24 outputs the input signals X(i) to either the main multiplier 26 or a summing junction 28. The main multiplier 26 and the summing junction 28 are connected to the storage input lead 30 which is connected to a storage unit 32. The output signal of the storage unit 32 is connected by a loopback multiplier 34 to the summing junction 28 and by a multiplier 36 to the control unit 24. The storage input lead 30 is further connected to an output multiplier 38 and thence to an output terminal 40.

In operation, the digital input signals X(i) are provided to the input terminal 22 and from there to the control unit 24. In the control unit 24, the input signal X(i) is subtracted from a multiplied signal from the (1/N) multiplier 36. The multiplied signal, which is the content of storage unit 32, is representative of the recursive average of the previous input signals. The absolute value of the difference between the input signal X(i) and the multiplied signal is then compared to the predetermined noise threshold T.

If the difference exceeds the noise threshold T indicating a step change, the input signal X(i) is supplied to the main multiplier 26 for multiplication by N and is then outputted to storage input lead 30. The signal on the storage input lead 30 is provided both to the storage unit 32 and to the output multiplier 38 for multiplication by 1/N and then final output out of the output terminal 40 as output signal X(i).

If the difference does not exceed the noise threshold T indicating noise, the input signal X(i) is switched to the summing junction 28 where it is combined or summed with a loopback signal equal to the output of the storage unit 32 multiplied in the looped back multiplier 34 by a factor of $(N-1)/N$. The output of the summing junction 28 which is equal to $((N-1)/N)Z^{-1}+X(i)$ is then provided to the storage input lead 30 and is outputted as previously explained. It will be noted that since the loopback multiplier 34 provides a multiplication constant that a large number of input signals X(i) would normally be required if a step change were made through this path which is the case for the prior art recursive averaging filters. For reference purposes, referring to FIG. 4, therein is shown a prior art filter step response, and referring to FIG. 5, therein is shown the step response of the present invention under identical step changes. The blow-up portion in FIG. 5 indicates the fluctuation due to the predetermined threshold T.

Figure 3:
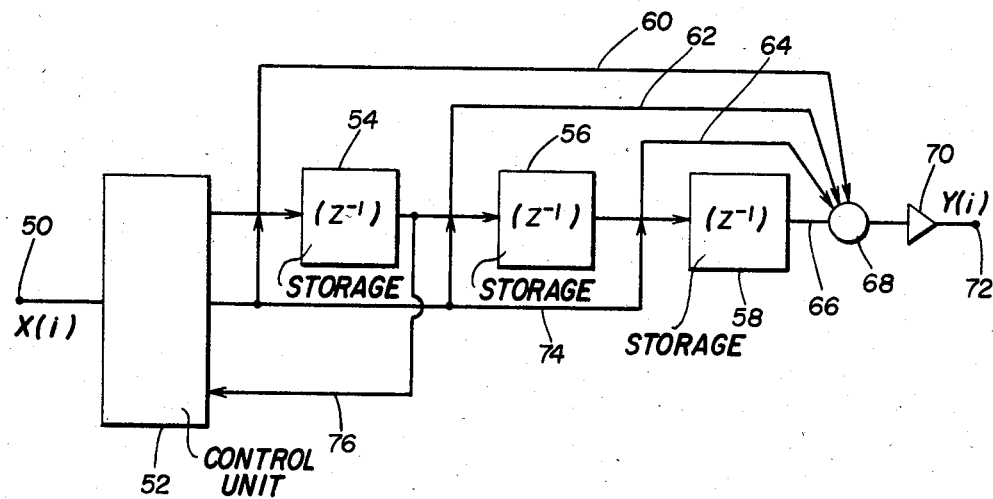
FIG. 3 is a block diagram of a nonrecursive filter embodying the present invention.

Referring now to FIG. 3, therein as shown a diagram of a nonrecursive averaging filter incorporating the present invention.

An input terminal 50 is connected to a control unit 52 which is connected to a series of storage units designated as first, second, and third storage units 54, 56, and 58 respectively. The signals out of the control unit 52, the first, second, and third storage units 54, 56, and 58 are connected by input, first, second, and third leads 60, 62, 64, and 66, respectively, to a summing junction 68. The output of the summing junction is connected to an output multiplier 70 and thence to an output terminal 72.

The control unit 52 further has a step lead 74 which is connected to the inputs of the first, second, and third storage units 54, 56, and 58, respectively. A feedback lead 76 is connected between the first and second storage units 54 and 56 and the control unit 52.

For purposes of convenience, the filter has been shown with three storage units, but those skilled in the art would be aware that any number more than two storage units are possible and a greater number would be desireable to increase noise immunity.

In operation, an input signal X(i) provided to the terminal 50 is compared in the control unit 52 with the signal stored in the first storage unit 54 as sensed over the feedback lead 76. If the difference the absolute value of the input signal X(i) and the signal in the first storage unit 54, which may be a random signal initially, exceeds the predetermined threshold T, the output signal of the control unit 52 will be switched to the step lead 74 which will cause the previous signals in the storage units 54, 56, and 58 to be replaced by the new input signal X(i) which will then be summed in the summing junction 68 and multiplied by $1/N+1$ in the output multiplier 70 and then outputted from the terminal 72 as a nonrecursive averaged signal Y(i) of the input signal X(i).

If the difference is less than the noise threshold T indicating the lack of a step change, the input signal X(i) will be provided on the first input line 60 to the summing junction 68. The signals in the first, second, and third storage units will be similarly provided respectively over the first, second, and third leads to the summing junction 68. The contents of the three storage units and the input signal X(i) then will be summed at the summing junction 68 and then multiplied by $1/N+1$ by the output multiplier 70 before outputted from the terminal 76. After the output signal Y(i) is provided, the signals in the storage units are shifted with X(i) stored in the first storage unit 54, the contents of the first storage unit 54 stored in the second storage unit 56, and the contents of the second storage unit 56 stored in the third storage unit 58.

Figure 4:
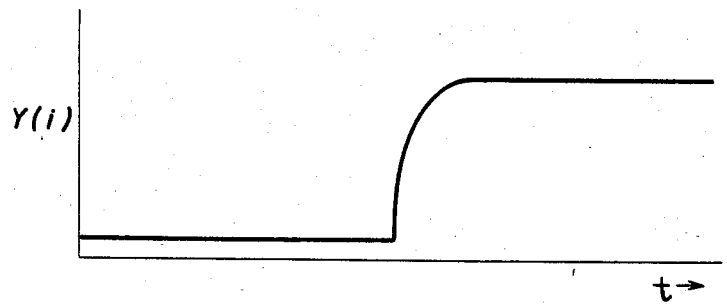
FIG. 4 is a graph of the step response of a prior art filter.
Figure 5:
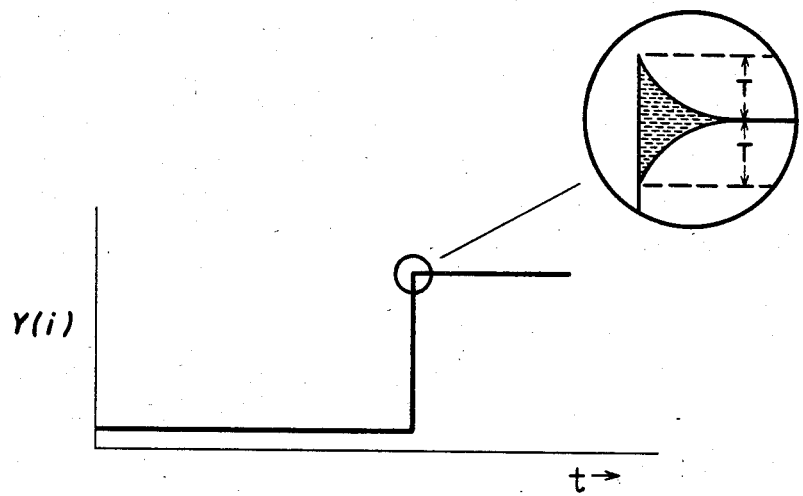
FIG. 5 is a graph of the step response of a filter embodying the present invention.

The settling time for a prior art nonrecursive filter is shorter than that of the prior art recursive filter because the nonrecursive filter output depends only on the present and past values of input as compared to the recursive filter which requires an output which depends both on the input and the previous values of the output; however, it still will be similar to FIG. 4 when compared to the settling time of the FIG. 3 filter.

It should be noted that the noise reduction factor of either filter embodying the present invention may be improved by putting in an input signal M times larger than is desired for the output signal and providing a greater division before outputting as for example by increasing the divide block 18 by M or the reciprocal multiplying factor 1/M of the output multipliers 38 and 70.

As many possible embodiments may be made of the invention without departing from the scope thereof, it is to be understood that all matters set forth herein or shown in the accompanying drawing is to be interpreted in an illustrative and not a limiting sense.

I claim:

1. Signal processing apparatus for digital signals comprising:
    input means for receiving digital input signals;
    storage means for storing signals provided thereto as stored digital signals;
    output means responsive to digital signals provided to said storage means for providing digital output signals; and
    control means responsive to outputs of said input means and to said storage means for computing a difference between digital input signals and a predetermined portion of said digital signals stored in said storage means, comparing said difference with a predetermined difference indicative of noise and, in response to a said difference less than said predetermined difference, multiplying the magnitude of the stored digital signals by a predetermined factor to obtain a signal product and adding to the signal product said digital input signals.

2. The apparatus as claimed in claim 1 wherein said output means includes output multiplier means for providing multiplied signals proportional to the digital signals provided to said storage means.

3. The apparatus as claimed in claim 2 wherein said control means multiplies the digital signals in said storage means by $(N-1)/N$, where N equals a predetermined number of successive digital signals to be sampled.

4. The apparatus as claimed in claim 3 wherein said output multiplier means multiplies the digital signals provided said storage means by $1/N$.

5. Signal processing apparatus for digital signals comprising:
    input means for receiving digital input signals;
    storage means for containing stored digital signals;
    means for obtaining a portion of said stored digital signals;
    adder means for adding the portion of said stored digital signals and said digital input signals to provide combined digital signals;
    multiplier means;
    output means for providing digital output signals proportional to said combined digital signals; and
    control means responsive to outputs of said input means and said storage means for computing a difference between the digital input signals and a predetermined portion of said digital signals stored in said storage means, comparing said difference with a predetermined difference indicative of a noise threshold and, in response, applying said digital input signals selectively through one of (1) said adder means and (2) said multiplier means to said output means.

6. Signal processing apparatus for digital signals comprising:
    input means for receiving digital input signals;
    first multiplier means for multiplying digital signals provided thereto by a first factor to provide multiplied digital signals;
    storage means containing stored digital signals;
    first feedback multiplier means for providing first feedback digital signals proportional to said stored digital signals multiplied by a second factor;
    second feedback multiplier means for providing second feedback digital signals proportional to said stored digital signals multiplied by a third factor;
    adder means for adding said first feedback and digital input signals to obtain combined digital signals, and applying said combined digital signals to said storage means;
    output means for providing digital output signals; and
    control means responsive to outputs of said input means and said second feedback multiplier means for computing a difference between the said stored digital signals multiplied by the third factor and said digital input signals, comparing said difference with a predetermined difference corresponding to a noise threshold and, in response, selectively applying (1) said second factor multiplied digital signals through said adder means, to said storage and output means when said difference is less than said predetermined difference indicative of a step input change or (2) said third factor multiplied digital signals to said storage and output means when said difference is greater than said predetermined difference.

7. The apparatus as claimed in claim 6 wherein said output means includes output divider means for dividing the digital signals provided thereto to provide said digital output signals.

8. The apparatus as claimed in claim 7 wherein said feedback multiplier means multiplies said stored digital signals by $(N-1)/N$, where N equals a predetermined number of digital signals to be sampled.

9. The apparatus as claimed in claim 8 said first multiplier means multiplies the digital input signals provided thereto by N and said output divider means multiplies the digital signals provided thereto by $1/MN$, where M equals a predetermined factor by which the input signals are larger than the output signals whereby the effects of noise are reduced.

10. Signal processing apparatus for digital signals comprising:
    input means for receiving digital input signals;
    a plurality of storage means for storing sequential digital signals provided thereto as a plurality of stored digital signals, said plurality of storage means including first storage means having a first stored signal provided by said input means;
    adder means for adding said digital input signal and each of said plurality of stored digital signals to provide combined digital signals;
    output means for supplying digital output signals from said adder means, the output signals being proportional to said combined digital signals; and
    control means responsive to outputs of said input means and said first storage means for calculating a difference between said input and first stored signals, comparing said difference with a predetermined difference corresponding to a noise threshold and, in response, applying said input signal (1) to only said first storage means and sequentially shifting digital signals stored in said plurality of storage means when said difference is less than said predetermined difference and (2) to inputs of said plurality of storage means when said difference is greater than said predetermined difference.

11. The apparatus as claimed in claim 10 wherein said output means includes output multiplier means for multiplying the combined digital signals by $1/(N+1)$ to provide the digital output signals, where N equals the number of storage means.

12. A method for processing signals comprising:
receiving input signals;
storing previously received successive input signals;
determining a difference between a said input signal and one of said stored signals;
if the difference is at least a predetermined difference, indicative of a step input change, replacing said one stored signal with said input signal as a new stored signal and outputting said new stored input signal; and
if the difference is less than the predetermined difference, indicative of noise, combining said input signal with said stored signal to provide a combined signal, replacing said stored signal with said combined signal as a stored combined signal and outputting said stored combined signal.

13. A method for processing digital signals comprising:
receiving input signals;
storing previously received input signals to provide stored signals;
determining a difference between a said input signal and a predetermined portion of one of said stored signals;
when said difference is at least a predetermined difference, indicative of a step input change, replacing said one of said stored signals with a first signal proportional to said input signal and outputting said first signal;
when said difference is less than said predetermined difference, indicative of noise, combining said input signal with a further predetermined portion of said one of said stored signals to provide a combined signal and outputting said combined signal.

14. A method for processing digital signals comprising:
receiving input signals;
storing previously successively received input signals to provide stored signals;
determining a difference between a said input signal and a first one of said stored signals;
if said difference is less than a predetermined difference, indicative of noise, replacing a second one of said stored signals with the first stored signal and replacing said first stored signal with said input signal;
if said difference is equal to or greater than said predetermined difference, indicative of a step input change, replacing said first and second stored signals with said input signal;
summing said input and stored signals to provide a summed signal;
dividing said summed signal by a number of summed signals to provide an average signal; and
outputting said average signal.

15. An averaging type digital filter, comprising:
first means for sampling input digital signals;
a storage means;
second means for storing digital signals derived from said input samples in said storage means;
third means for computing an input sample average stored in said storage means;
fourth means for obtaining the difference between said sample average and an input sample;
fifth means for determining that said difference is below a predetermined threshold difference, indicative of noise, and in response, adding to said sample average said input sample to obtain a combined sample and storing the combined sample in said storage means; and
sixth means for applying the digital signals stored in said storage means to an output.

16. The filter of claim 15, including further means for multiplying the samples stored in said storage unit by a factor $(N-1)/N$, where N is a predetermined number of samples.

17. The filter of claim 16, including seventh means for further dividing an output of said second means by N.

18. In an averaging type digital filter including an input for receiving incoming digital signals, storage means for storing previously received digital signals, means for obtaining a sum of the incoming digital signals and stored digital signals and means for averaging the sum,
a circuit for improving the step response characteristic of the filter, comprising means for obtaining at least portions of said stored digital signals, means for determining a difference between magnitudes of incoming digital signals and said portions of said digital signals stored in said storage means; and means for controlling the averaging means to average said contents only when said difference is below a predetermined threshold difference indicating that a change in input signal is attributable to noise.

* * * * *